United States Patent [19]
Corman et al.

[11] Patent Number: 5,990,712
[45] Date of Patent: Nov. 23, 1999

[54] HARMONIC GENERATOR

[75] Inventors: David Warren Corman; Kenneth Vern Buer, both of Gilbert; Bill Tabano Agar, Jr., Chandler, all of Ariz.

[73] Assignee: Motorola, Inc., Schaumburg, Ill.

[21] Appl. No.: 08/943,439

[22] Filed: Oct. 3, 1997

[51] Int. Cl.⁶ ...................................................... H03B 19/00
[52] U.S. Cl. ............................ 327/121; 327/407; 330/129
[58] Field of Search ..................... 327/113, 119, 327/117, 121, 122, 407; 331/76; 330/129, 132, 285

[56] References Cited

U.S. PATENT DOCUMENTS 5,712,593  1/1998  Buer et al. ............................... 330/129

Primary Examiner—Kenneth B. Wells
Assistant Examiner—Minh Nguyen
Attorney, Agent, or Firm—Walter W. Nielsen; James E. Klekotka

[57] ABSTRACT

A harmonic generator (20) converts an input signal (24) at a fundamental frequency (28) into an output signal (32) at a harmonic frequency (34). A non-linear device (22) converts the input signal (24) into an intermediate signal (38) in which the harmonic frequency (34) has a maximized amplitude (40) determined by a conduction angle (26). A harmonic filter (68) produces a filtered signal (70) proportional to the amplitude (40) of the harmonic frequency (34) within the intermediate signal (38). A detector (80) produces a control signal (82) proportional to the amplitude of the filtered signal (70). A control circuit (84) produces a variable bias signal (50) for non-linear device (22), bias signal (50) being proportional to the amplitude of the control signal (82) and determining the conduction angle (26). An output filter (88) converts the intermediate signal (38) into an output signal (32) at the harmonic frequency (34).

20 Claims, 3 Drawing Sheets

| | HARMONIC | CONDUCTIVE ANGLE $\alpha = \dfrac{240°}{H}$ | CONDUCT FROM $90° - \dfrac{\alpha}{2}$ | CONDUCT TO $90° + \dfrac{\alpha}{2}$ |
|---|---|---|---|---|
| | 2 th | 120.0° | 30.0° | 150.0° |
| | 3 th | 80.0° | 50.0° | 130.0° |
| | 4 th | 60.0° | 60.0° | 120.0° |
| | 5 th | 48.0° | 66.0° | 114.0° |
| | 6 th | 40.0° | 70.0° | 110.0° |
| | 7 th | 34.3° | 72.9° | 107.1° |
| | 8 th | 30.0° | 75.0° | 105.0° |
| | 9 th | 26.7° | 76.7° | 103.3° |
| | 10 th | 24.0° | 78.0° | 102.0° |
| | 11 th | 21.8° | 79.1° | 100.9° |
| | 12 th | 20.0° | 80.0° | 100.0° |
| | 13 th | 18.5° | 80.8° | 99.2° |
| | 14 th | 17.1° | 81.4° | 98.6° |
| | 15 th | 16.0° | 82.0° | 98.0° |
| | 16 th | 15.0° | 82.5° | 97.5° |
| | 17 th | 14.1° | 82.9° | 97.1° |
| | 18 th | 13.3° | 83.3° | 96.7° |
| | 19 th | 12.6° | 83.7° | 96.3° |
| | 20 th | 12.0° | 84.0° | 96.0° |
| | 21 th | 11.4° | 84.3° | 95.7° |
| | 22 th | 10.9° | 84.6° | 95.5° |
| | 23 th | 10.4° | 84.8° | 95.2° |
| | 24 th | 10.0° | 85.0° | 95.0° |

HARMONIC GENERATOR

FIELD OF THE INVENTION

The current invention relates to harmonic generators. More specifically, the current invention relates to harmonic generators for the generation of harmonics by the use of feedback to control the conduction angle of a non-linear device.

BACKGROUND OF THE INVENTION

In microwave and millimeter-wave harmonic generators, the desired harmonic is often produced by passing a sinusoidal signal through a non-linear device while tailoring the conduction angle of the non-linear device so as to maximize the level of the desired harmonic. A well-known relationship between harmonic amplitude and conduction angle is demonstrated in a classic Fourier series. The desired harmonic, once optimized, can then be isolated through filtration and amplification.

When high-order (fifth or greater) harmonics are to be obtained, this conduction-angle approach poses several problems. The allowable range of conduction angles decreases rapidly with high-order harmonics, requiring tighter and tighter conduction angles as the frequency rises. The difficulty of maintaining a tight conduction angle rises with the frequency. Normal variation in the requisite non-linear devices requires that each generator undergo tedious individual conduction angle adjustment in order to maximize the desired harmonic output. Such adjustments are incompatible with low cost, high volume production environments.

An additional problem arises in that such adjustments, once made, will vary as the non-linear components vary over time, requiring periodic calibration or re-adjustment.

For these reasons, high-frequency microwave and millimeter-wave harmonic generators are usually low-order multipliers (doublers, triplers, etc.) cascaded and combined to produce the desired frequency. This approach is not without its own problems. First, being a series of individual multipliers, such a harmonic generator requires more parts and more unique circuits than a single non-linear device harmonic generator, thus increasing cost while reducing reliability. Second, being composed of a plurality of cascaded multipliers, it is not possible to produce high-order prime-number harmonics ($5^{th}$, $7^{th}$, $11^{th}$, $13^{th}$, $17^{th}$, etc.).

What is needed is a high-order harmonic generator wherein the conduction angle of a non-linear device is automatically controlled to maximize the output of the desired harmonic, thus eliminating the need for manual adjustment and compensating for both initial and temporal device variation.

BRIEF DESCRIPTION OF THE DRAWINGS

A more complete understanding of the present invention may be derived by referring to the detailed description and claims when considered in connection with the figures, wherein like reference numbers refer to similar items throughout the figures, and:

DETAILED DESCRIPTION OF THE DRAWINGS

Figure 1:
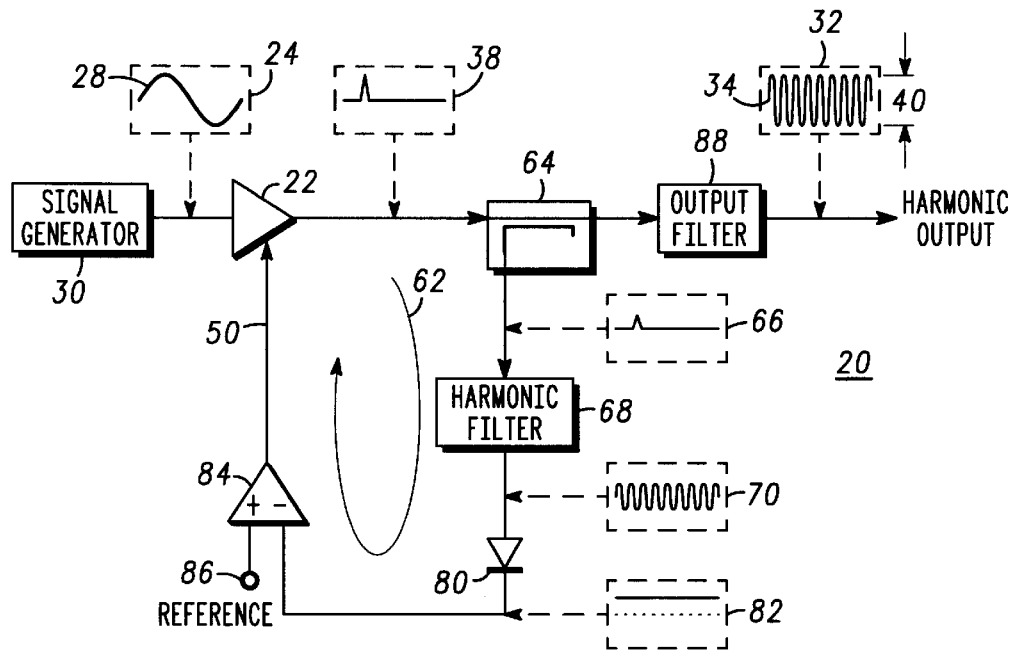
FIG. 1 shows a block diagram of a harmonic generator in accordance with a first preferred embodiment of the present invention.
Figure 2:
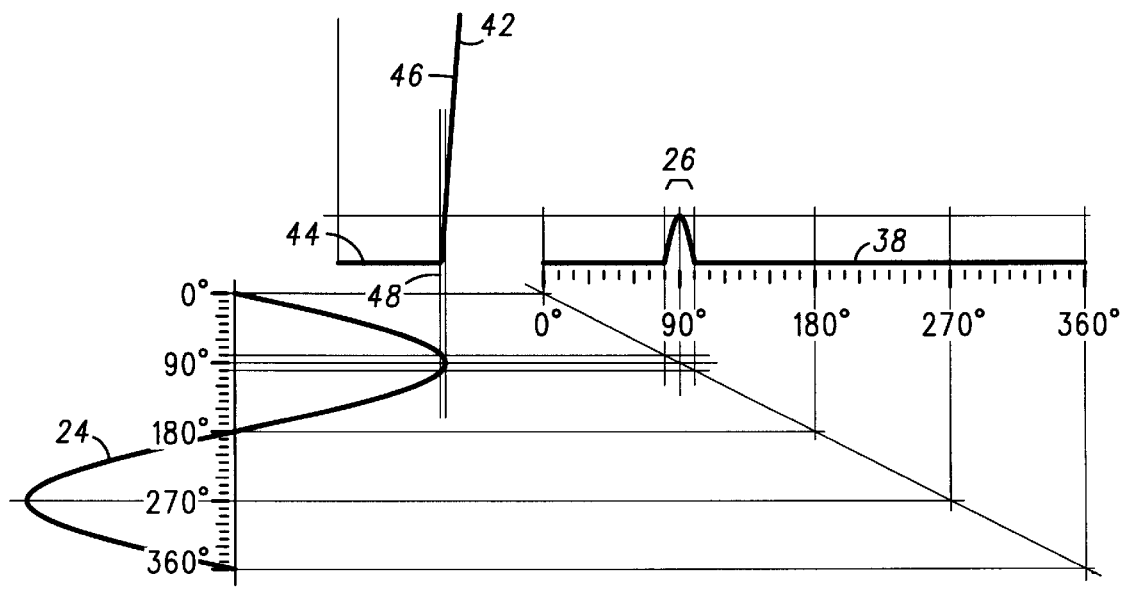
FIG. 2 shows a diagram illustrating the operation of a non-linear device conducting a sinusoidal input waveform over a given conduction angle in accordance with preferred embodiments of the present invention.

FIG. 1 shows a block diagram of a harmonic generator 20 in accordance with a first preferred embodiment of the present invention. FIG. 2 shows a diagram illustrating the operation of a non-linear device 22 conducting a sinusoidal input waveform 24 over a given conduction angle 26 in accordance with preferred embodiments of the present invention. The following discussion refers to FIGS. 1 and 2.

In harmonic generator 20, oscillating input signal 24 at a given fundamental frequency 28 is produced by signal generator 30 and converted to an oscillating output signal 32 at a desired output frequency 34 that is a harmonic 36 (FIG. 4) of input frequency 28. In the preferred embodiments, fundamental frequency 28 is exemplified as being a microwave or millimeter-wave frequency to emphasize that the present invention readily facilitates the generation of high-order (fifth and greater) harmonics 36 at these frequencies. Those skilled in the art will appreciate, however, that the scope of the current invention is applicable to the generation of harmonics 36 at any frequency.

Non-linear device 22 converts input signal 24 into an intermediate signal containing at least desired harmonic 34. In the preferred embodiments, non-linear device 22, which can be a simple amplifier utilizing a bipolar junction transistor, field-effect transistor, or other non-linear component such as a diode or diode pair, is substantially a class-C amplifier amplifying input signal 24 over conduction angle 26 to convert input signal 24 into a class-C intermediate signal 38 at input frequency 28. Being a class-C signal, intermediate signal 38 is a multi-harmonic intermediate signal 38. Conduction angle 26 is adjusted so that the amplitude 40 of desired harmonic 34 is maximized.

Those skilled in the art will appreciate that non-linear device 22 is treated as a single device for simplicity only, and it can include additional amplification as required for either input signal 24 or intermediate signal 38.

Non-linear device 22 has a response curve 42 having a non-conducting region 44 and a conducting region 46 defined by a conduction threshold 48. Threshold 48 is controlled by a variable bias signal 50 (voltage or current, depending upon device type). During that portion of each cycle where input signal 24 has an instantaneous amplitude below threshold 48, intermediate signal 38 exhibits an instantaneous amplitude of zero. During that portion of each cycle where input signal 24 has an instantaneous amplitude above threshold 48, intermediate signal 38 exhibits an instantaneous amplitude that is a function of the instantaneous amplitude of input signal 24 and the slope of conducting region 46 of response curve 42. That portion of each cycle where input signal 24 has an instantaneous amplitude above threshold 48, i.e., intermediate signal 38 has an instantaneous amplitude above zero, is conduction angle 26.

Amplitude 40 of desired harmonic 34 is maximized by configuring non-linear device 22 to conduct over an appropriate conduction angle 26. Conduction angle 26 is a function of both the amplitude of input signal 24 and conduction threshold 48. In the preferred embodiments, input signal 24 is substantially a continuous unmodulated sinusoidal signal, unvarying in amplitude, frequency, and phase, causing conduction angle 26 to be solely a function of conduction threshold 48. Adjusting variable bias signal 50 will alter conduction threshold 48 and affect conduction angle 26 accordingly. Those skilled in the art will appreciate that while input signal 24 is depicted as substantially sinusoidal, any input signal can be utilized for input signal 24 provided that desired harmonic 34 is either present in input signal 24 or is capable of being generated by non-linear device 22 from input signal 24.

For purposes of example, the following discussion assumes that output signal 32 is to be the eleventh harmonic 52 of input signal 24. Eleventh harmonic 52 is chosen to emphasize that the present invention not only facilitates the generation of high-order harmonics 54, but is adapted even to the generation of prime (fifth, seventh, eleventh, thirteenth, seventeenth, nineteenth, twenty-third, etc.) harmonics 56, which is impractical utilizing prior-art techniques.

With input signal 24 being substantially constant in amplitude, conduction angle 26 is a function of conduction threshold 48. Conduction threshold 48, in turn, is a function of bias signal 50. Therefore, varying bias signal 50 varies conduction angle 26.

Figures 3, 4:
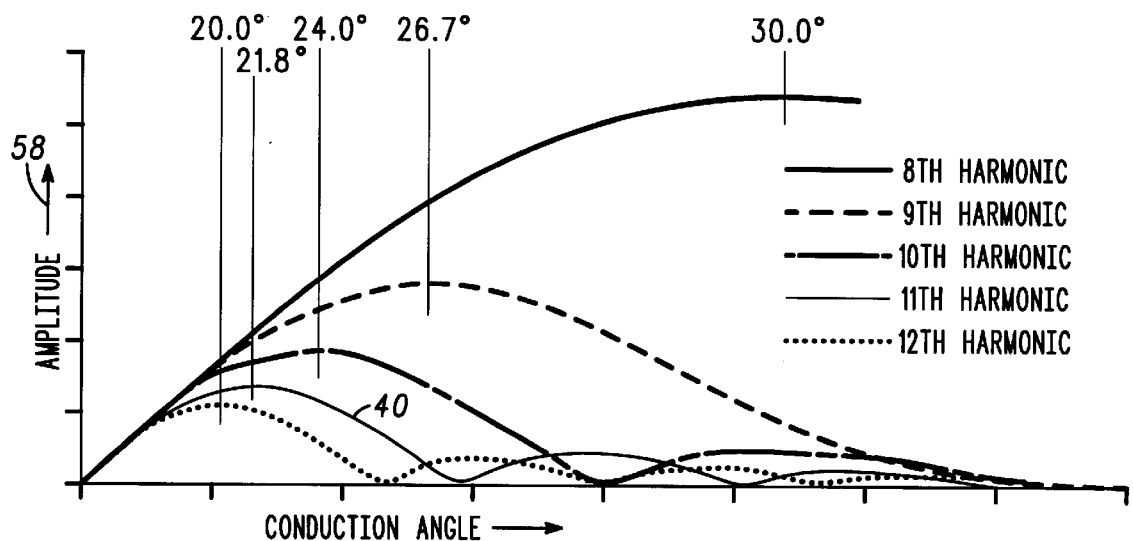
FIG. 3 shows a graph of a portion of a Fourier Series depicting harmonic amplitude versus conduction angle in accordance with preferred embodiments of the present invention.
FIG. 4 depicts a table of conduction angles versus harmonic frequencies in accordance with preferred embodiments of the present invention.

FIG. 3 shows a graph of a portion of a Fourier Series depicting harmonic amplitude 58 versus conduction angle 26 and FIG. 4 depicts a table 60 of conduction angles 26 versus harmonic frequencies 36 in accordance with preferred embodiments of the present invention. The following discussion refers to FIGS. 1 through 4.

Assuming input signal 24 is sinusoidal, amplitude 58 of each harmonic 36 of input signal 24 present in intermediate signal 38 is a function of conduction angle 26. It is therefore desirable that conduction angle 26 be adjusted to maximize amplitude 58 of desired harmonic 34. Optimum conduction angle 26, in degrees, is computed by the formula $\alpha=240°/H$. Table 60 in FIG. 4 depicts optimum conduction angle ($\alpha$) 26 for each harmonic (H) 36 from the second through the twenty-fourth as an absolute angle ($\alpha$) and as a portion of each cycle of input signal 24 in which conduction takes place. This latter depiction presumes input signal 24 is a sinusoidal signal with a positive peak at +90°. Therefore, conduction over conduction angle 26 takes place from 90°−($\alpha$/2) to 90°+($\alpha$/2). For example, for eleventh harmonic 52, it is desirable to establish a conduction angle 26 of approximately 21.8°, i.e. for non-linear device 22 to conduct from approximately 79.1° to 100.9° during each cycle of input signal 24.

It should be noted that all angles in table 60 are expressed to the nearest tenth of a degree. Since the formula for computing conduction angle 26 is an approximation, table 60 contains falsely accurate data. Those skilled in the art will recognize that these falsely accurate data are numerical only, with the relationships between conduction angles 26 remaining valid.

In the present invention, control of conduction angle 26 is accomplished via a feedback loop 62 (FIG. 1). In feedback loop 62, intermediate signal 38 is sampled by a sampler 64 coupled to non-linear device 22. Sampler 64 passes intermediate signal 38 substantially unchanged while simultaneously providing a sampled portion 66 of intermediate signal 38.

Sampled intermediate signal portion 66 is passed to a harmonic filter 68 coupled to sampler 64. Harmonic filter 68 produces a filtered signal 70 in which desired harmonic 34 has a greater amplitude than any other harmonic 36, that amplitude being directly proportional to amplitude 40 of desired harmonic 34, e.g. eleventh harmonic 52, within sampled intermediate signal portion 66.

Since, as seen in FIG. 3, the maximum amplitude achieved by a given harmonic 36 is inversely related to the number of that harmonic 36, harmonic filter 68 need only be a relatively simple high-pass filter passing desired harmonic 34 while suppressing lower harmonics 36. In the preferred embodiments, harmonic filter 68 passes eleventh harmonic 52 and attenuates tenth and lower harmonics 72 and 74.

As shown in FIG. 3, the absolute difference in maximum amplitudes for optimum conduction angles 26 decreases as frequency increases. For higher frequencies, improved performance of feedback loop 62 at a given harmonic 36 is obtained when harmonic filter 68 is a narrow band-pass filter with rejection of both lower and higher harmonics 36, with significant rejection of adjacent harmonics 36. For example, at conduction angle 26 of 21.8°, maximizing the amplitude of eleventh harmonic 52, the tenth and twelfth harmonics 72 and 76 have slightly greater and lesser amplitudes, respectively, than eleventh harmonic 52. It is desirable, therefore, that harmonic filter 68 passes eleventh harmonic 52 while suppressing lower and higher harmonics 74 and 78 and significantly suppressing tenth and twelfth harmonics 72 and 76.

Those skilled in the art will appreciate that harmonic filter 68 is discussed as though it were a simple single-stage passive band-pass or high-pass filter for purposes of simplicity only, and that in practice harmonic filter 64 can be an active filter, can possess multiple stages, and/or can include amplification stages as required for either sampled signal 66 or filtered signal 70.

Filtered signal 70 is detected by a detector 80 coupled to harmonic filter 68 to produce a control signal 82. Control signal 82 is substantially a d-c signal whose amplitude is a function of the amplitude of filtered signal 70, hence a function of amplitude 40 of eleventh harmonic 52 present in intermediate signal 38.

Conduction-angle control circuit 84, typically an operational amplifier, is coupled between detector 80 and non-linear device 22. Control circuit 84 processes control signal 82, establishing the required loop gain, polarity, etc., to produce bias signal 50. A reference voltage 86 is provided to control circuit 84 to establish a base level for conduction threshold 48 of non-linear device 22. Since, as previously mentioned, conduction angle 26 is a function of variable bias signal 50, feedback loop 62 automatically adjusts conduction angle 26 so as to maximize amplitude 40 of desired harmonic 34 in intermediate signal 38, i.e. eleventh harmonic 52 in the preferred embodiments.

Those skilled in the art will appreciate that while the preferred embodiments include sampler 64 within feedback loop 62, sampler 64 is not a required component and can be replaced by other means for passing a portion or all of intermediate signal 38 to harmonic filter 68.

A narrow-band output filter 88 is coupled to sampler 64 and filters intermediate signal 38 to pass only desired harmonic 34, i.e. eleventh harmonic 52, and to produce output signal 32. Those skilled in the art will appreciate that conventional technologies are used to implement output filter 88, which can be passive or active, can possess multiple stages, and/or can include amplification stages as required for either intermediate signal 38 or output signal 32.

Figure 5:
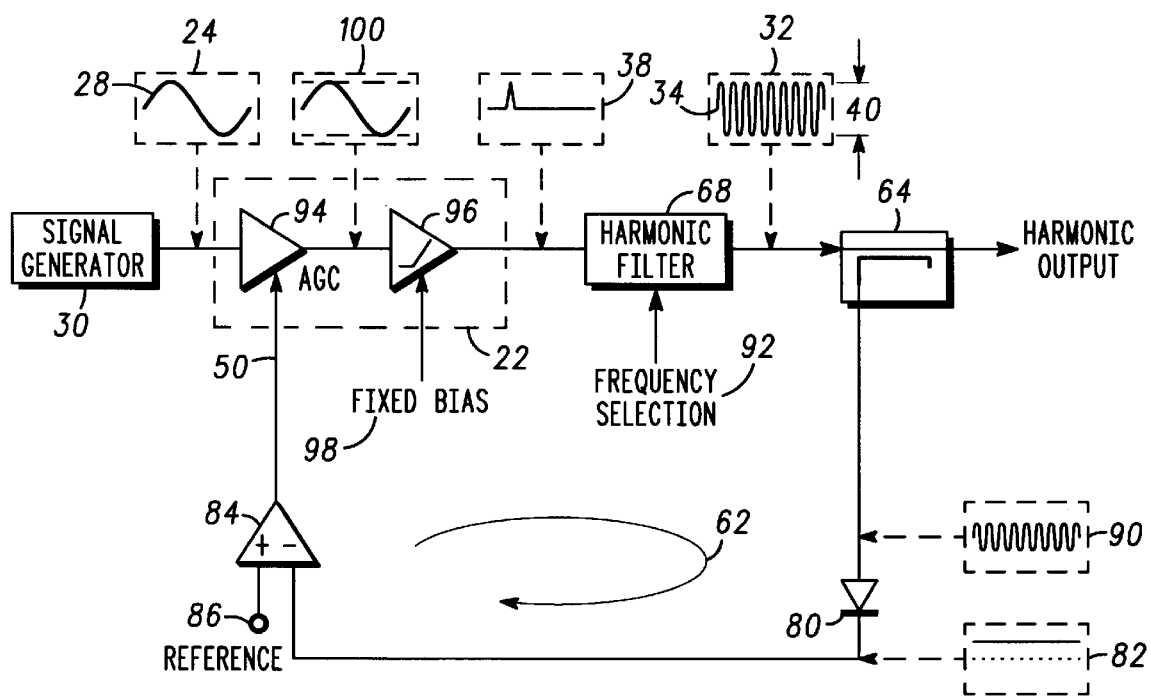
FIG. 5 shows a block diagram of a harmonic generator in accordance with a second preferred embodiment of the present invention.

FIG. 5 shows a block diagram of harmonic generator 20 in accordance with a second preferred embodiment of the present invention. The following discussion refers to FIGS. 1 through 5.

The second preferred embodiment depicted in FIG. 5 illustrates several variations of components depicted in the first preferred embodiment in FIG. 1. One such variation is the relocation of harmonic filter 68 from a position in feedback loop 62 following sampler 64 to a position immediately following non-linear device 22 and ahead of sampler 64. Being coupled to non-linear device 22, harmonic filter 64 is a narrow band-pass filter whose output is output signal 32. Harmonic filter 68 thus replaces output filter 88. In this configuration, sampler 64 is coupled to harmonic filter 68 and samples output signal 32 to produce a sampled portion 90 of output signal 32. Sampled output signal portion 90 is substantially identical to filtered signal 70 (FIG. 1). Detector 80 is coupled to sampler 64, and it detects sampled output signal portion 90.

Since, in the second preferred embodiment, harmonic filter 68 is the only filter, harmonic filter 68 can be made frequency selectable using techniques familiar to those skilled in the art. A frequency-selection signal 92 is used to select from among a plurality of harmonics 36 (FIG. 3). Harmonic generator 20 then becomes a selectable-harmonic generator 20.

Those skilled in the art will appreciate that narrow band-pass harmonic filter 68 can, in practice, be an active filter, can possess multiple stages, and/or can include amplification stages as required for either intermediate signal 38 or output signal 32. In another variation from the first preferred embodiment depicted in FIG. 1, non-linear device 22 can be constructed as a two-stage device containing a variable-gain element 94 and a non-linear element 96 (FIG. 5) at a fixed bias 98. By having input signal 24 be substantially a continuous and unmodulated sinusoidal signal, unvarying in amplitude, the input to variable-gain element 94 is of a known constant amplitude. Feedback loop 62 can then be used to vary the gain of variable-gain element 94 to produce an adjusted input signal 100 whose amplitude is a function of amplitude 40 of desired harmonic 34, e.g. eleventh harmonic 52, within intermediate signal 38. Since amplitude 40 of desired harmonic 34 within intermediate signal 38 is a function of conduction angle 26 (FIG. 2), holding conduction threshold 48 constant and varying the amplitude of adjusted input signal 100 as a function of amplitude 40 of desired harmonic 34 present in intermediate signal 38 will vary conduction angle 26 accordingly. Feedback loop 62 becomes a gain-control loop rather than a threshold-control loop.

In summary, the present invention provides harmonic generator 20 in which even high-order and/or prime-number harmonics 54 and 56 can easily be generated in a straightforward and cost-effective manner through the use of a frequency-selective feedback loop 62 controlling a non-linear device 22.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A harmonic generator for converting an input signal at a first frequency into an output signal at a second frequency, said second frequency being a higher order harmonic of said first frequency, said harmonic generator comprising:

a non-linear device configured to conduct over a conduction angle of said input signal, said conduction angle being established to maximize said higher order harmonic in said output signal, wherein said non-linear device is further configured to convert said input signal into an intermediate signal in which said second frequency is maximized;

a harmonic filter coupled to said non-linear device and configured to produce a filtered signal containing said output signal at second frequency, wherein said harmonic filer maximizes said higher order harmonic in said filtered signal;

a detector coupled to said harmonic filter and configured to detect said filtered signal; and a conduction-angle control circuit coupled to said non-linear device and to said detector and configured to control said conduction angle of said non-linear device.

2. A harmonic generator as claimed in claim 1 wherein:

said second frequency exhibits an amplitude within said intermediate signal;

said non-linear device has a variable bias signal;

said variable bias signal affects said conduction angle; and said variable bias signal is varied by said conduction-angle control circuit to maximize said amplitude of said second frequency within said intermediate signal.

3. A harmonic generator as claimed in claim 2 wherein:

said non-linear device comprises a variable-gain element configured to produce an adjusted input signal;

said non-linear device additionally comprises a non-linear element coupled to said variable-gain element and configured to convert said adjusted input signal into said intermediate signal; and said variable-gain element is varied in gain by said conduction-angle control circuit to maximize said amplitude of said second frequency within said intermediate signal.

4. A harmonic generator as claimed in claim 1 wherein said non-linear device is substantially a class-C amplifier configured to convert said input signal into substantially a class-C intermediate signal containing said second frequency.

5. A harmonic generator as claimed in claim 1 wherein said non-linear device comprises a diode configured to convert said input signal into an intermediate signal containing said second frequency.

6. A harmonic generator as claimed in claim 1 wherein said non-linear device comprises a diode pair configured to convert said input signal into an intermediate signal containing said second frequency at said first frequency.

7. A harmonic generator as claimed in claim 1 additionally comprising a signal generator configured to produce said input signal as substantially a sinusoidal signal at said first frequency.

8. A harmonic generator as claimed in claim 7 wherein said signal generator is configured so that said input signal is substantially unmodulated.

9. A harmonic generator as claimed in claim 7 wherein said signal generator is configured so that said input signal is substantially unvarying in amplitude, frequency, and phase.

10. A harmonic generator as claimed in claim 1 wherein:

said non-linear device converts said input signal into said intermediate signal comprising at least said second frequency, said second frequency having an amplitude determined by said conduction angle;

said harmonic filter filters said intermediate signal to produce said filtered signal, said filtered signal having an amplitude proportional to said amplitude of said second frequency within said intermediate signal;

said detector detects said filtered signal to produce a control signal, said control signal having an amplitude proportional to said amplitude of said filtered signal; and said conduction-angle control circuit processes said control signal to produce a bias signal, said bias signal being a function of said amplitude of said control signal, and said conduction angle of said non-linear device being a function of said bias signal.

11. A harmonic generator as claimed in claim 10 wherein:

said harmonic generator additionally comprises a sampler coupled to said non-linear device, said sampler being configured to pass said intermediate signal and to provide a sampled portion of said intermediate signal; and said harmonic filter is coupled to said sampler and configured to filter said sampled portion of said intermediate signal.

12. A harmonic generator as claimed in claim 11 additionally comprising an output filter coupled to said sampler and configured to convert said intermediate signal into said output signal.

13. A harmonic generator as claimed in claim 10 wherein:

said harmonic filter is additionally configured to convert said intermediate signal to said output signal;

said harmonic generator additionally comprises a sampler coupled to said harmonic filter, said sampler being configured to pass said output signal and to provide a sampled portion of said output signal; and said detector is coupled to said sampler and configured to detect said sampled portion of said output signal.

14. A harmonic generator as claimed in claim 13 wherein:

said second frequency is one of a plurality of second frequencies, each of said second frequencies being a harmonic of said first frequency; and said harmonic filter is responsive to a frequency-selection signal and is configured to convert said intermediate signal into said one second frequency in response to said frequency-selection signal.

15. A harmonic generator as claimed in claim 1 wherein:

said harmonic filter is configured to pass said second frequency; and said harmonic filter is configured to attenuate harmonic frequencies of said first frequency which are lower harmonics than said second frequency.

16. A harmonic generator as claimed in claim 15 wherein said harmonic filter is configured to attenuate harmonic frequencies of said first frequency which are higher harmonics than said second frequency.

17. A harmonic generator as claimed in claim 1 wherein said second frequency is a fifth or greater harmonic of said first frequency.

18. A harmonic generator as claimed in claim 17 wherein said second frequency is a prime-number harmonic of said first frequency.

19. A harmonic generator for generating, from an input signal at a fundamental frequency, an output signal at a higher order harmonic frequency of said fundamental frequency, said harmonic generator comprising:

a signal generator configured to produce said input signal;

a non-linear device configured to conduct over a conduction angle of said input signal and to convert said input signal into an intermediate signal, said conduction angle being a function of a bias signal, wherein said non-linear device is configured to convert said input signal into said intermediate signal in which the amplitude of said second frequency is maximized;

a harmonic filter coupled to said non-linear device and configured to filter said intermediate signal to produce a filtered signal containing said higher order harmonic frequency, to have an amplitude proportional to said amplitude of said higher order harmonic frequency within said intermediate signal, and to attenuate harmonic frequencies of said intermediate signal other than said higher order harmonic frequency;

a detector coupled to said harmonic filter and configured to detect said filtered signal to produce a control signal, said control signal having an amplitude proportional to said amplitude of said filtered signal; and a conduction-angle control circuit coupled to said non-linear device and to said detector and configured to process said control signal to produce said bias signal, said bias signal being a function of said amplitude of said control signal.

20. A method for generating an oscillating output signal from an input signal having an input frequency, said output signal having an output frequency that is a higher harmonic of said input frequency, said method comprising the steps of:

producing said input signal at said input frequency at a known amplitude;

converting said input signal into an intermediate signal exhibiting at least said output frequency, said output frequency having an amplitude determined as a function of a conduction angle of said input signal, wherein said converting step further comprises the step of amplifying said input signal to produce said intermediate signal, said intermediate signal being substantially a class-C signal at said input frequency in which an amplitude of said output frequency is maximized as a function of said conduction angle;

filtering said intermediate signal to produce a filtered signal containing said output frequency, said filtered signal having an amplitude proportional to said amplitude of said output frequency within said intermediate signal; and controlling said conduction angle of said input signal in response to said filtering step.

* * * * *